United States Patent
Seki et al.

(10) Patent No.: US 6,652,995 B2
(45) Date of Patent: Nov. 25, 2003

(54) ORGANIC ELECTROLUMINESCENCE DEVICE

(75) Inventors: Mieko Seki, Minamiashigara (JP); Daisuke Okuda, Minamiashigara (JP); Hirohito Yoneyama, Minamiashigara (JP); Hidekazu Hirose, Minamiashigara (JP); Kiyokazu Mashimo, Minamiashigara (JP); Takeshi Agata, Minamiashigara (JP); Katsuhiro Sato, Minamiashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 59 days.

(21) Appl. No.: 09/973,800

(22) Filed: Oct. 11, 2001

(65) Prior Publication Data

US 2002/0182440 A1 Dec. 5, 2002

(30) Foreign Application Priority Data

Oct. 13, 2000 (JP) ........................ 2000-313190

(51) Int. Cl.[7] ............................................. H05B 33/12
(52) U.S. Cl. ....................... 428/690; 428/480; 428/704; 428/917; 313/504; 313/506
(58) Field of Search ................. 428/690, 917, 428/704, 480; 313/504, 506

(56) References Cited

U.S. PATENT DOCUMENTS 5,034,296 A * 7/1991 Ong et al. ............... 430/59
5,409,792 A * 4/1995 Yanus et al. ............. 430/59
5,674,635 A * 10/1997 Hsieh et al. ............. 428/690

FOREIGN PATENT DOCUMENTS

| JP | 08-087121 A | * | 4/1996 |
| JP | 08-087122 A | * | 4/1996 |
| JP | 08-295880 A | * | 11/1996 |
| JP | 2000-147874 | * | 5/2000 |

OTHER PUBLICATIONS

"Electrical Conduction and Low Voltage Blue Electroluminescence In Vacuum–Deposited Organic Films" by P.S. Vincent et al., Thin Solid Films 94, pp. 171–183 (1982).
"Organic Electroluminescence Diodes" by C. W. Tang et al., Appl. Phys. Lett., 51, pp. 913–915 (1987).
"Organic Electroluminescence Devices With A Starburst Amine As A Hole Transport Material" by T. Wakimoto et al. Extended Abstracts (The 40th Meeting, 1993); The Japan Society of Applied Physics, 30a–SZK–14, 1993.
Pretext for the 42nd Symposium on Macromolecules, 20J 21 (1993).
"Flexible Light–Emitting Diodes Made From Soluble Conducting Polymers" by G. Gustafsson et al., Nature vol. 357, pp. 477–479, 1992.
" Organic Electroluminescence Devices With A Mixed––Layer Structure" by Y. Mori et al., Extended Abstracts (The 38th Meeting, 1991); The Japan Society of Applied Physics, 31p–G12, 1991.
"Change Transport Polymers Based On Triphenylamine And Tetraphenybenzidine Moieties" by D.K. Murti et al., The Sixth International Congress on Advances in Non–impact Printing Technologies, pp. 306–311, 1990.
"Organic Electroluminescent Device With A Three–Layer Structure" by Chihaya Adachi et al., Japanese Journal of Applied Physics, vol. 27, No. 4, Apr. 1988, pp. L713–L715.

\* cited by examiner

Primary Examiner—Marie Yamnitzky
Assistant Examiner—Dawn Garrett
(74) Attorney, Agent, or Firm—Oliff & Berridge, PLC

(57) ABSTRACT

An organic electroluminescence device contains a hole transporting polyesters represented by the following formulae (I-1) or (I-2):

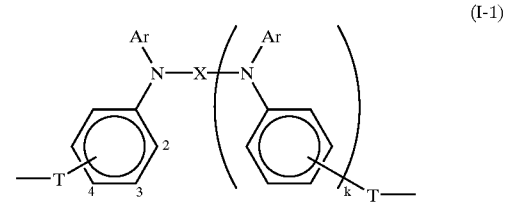

(I-1)

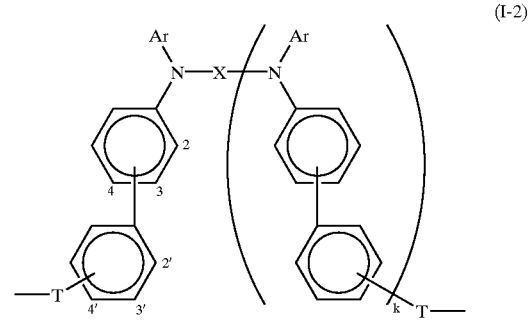

(I-2)

where Ar represents a substituted or unsubstituted monovalent polynuclear aromatic ring having a number of aromatic rings of 3 to 10, or a substituted or unsubstituted monovalent condensed aromatic ring having a number of aromatic rings of from 2 to 10, X represents a substituted or unsubstituted bivalent aromatic group, T represents a bivalent linear hydrocarbon group of 1 to 6 carbon atoms or bivalent branched hydrocarbon group of 2 to 20 carbon atoms and k represents 0 or 1.

7 Claims, 1 Drawing Sheet

ORGANIC ELECTROLUMINESCENCE DEVICE

BACKGROUND OF THE INVENTION

1. Field of the Invention

This invention concerns an organic electroluminescence device and, more specifically, it relates to an organic electroluminescence device which can be manufactured easily, and improved in stability and facilitate increase of area.

2. Description of the Related Art

The electroluminescence device (hereinafter also referred to as "EL device") is a self light emitting wholly solid device and since it has high visual recognizability and impact strength, a wide applicability is expected. Those using inorganic fluorescent materials are predominant at present and used generally. However, since they require an AC voltage of 200 volt or higher for driving, they involve a problem of high production cost and insufficient brightness. On the other hand, study for EL devices using organic compounds was started initially by using single crystals such as of anthracene. However, in the case of single crystals, the film thickness is as large as about 1 mm and a driving voltage of 100 volt or higher is necessary and the luminous efficacy is low. Therefore, it has been attempted to reduce the thickness by using a vapor deposition method (Thin Solid Films 94, pp.171–183 (1982)). However, in the thin film obtained by the vapor deposition method, since the driving voltage is still as high as 30V and the density of electrons-hole carriers are low in the film and the probability of generating photons by carrier recombination is low, no sufficient brightness can be obtained and they have not yet been put to practical use.

By the way, there has been reported recently an EL device of a function separation type in which a hole transporting organic low molecular weight compound and a fluorescent organic low molecular weight compound having electron transporting function are laminated successively as extremely thin films by a vacuum vapor deposition method on a transparent substrate, which can provide high brightness of 1000 cd/m$^2$ at a low voltage of about 10 V (Appl. Phys. Lett., 51, pp. 913–915 (1987)) and, ever since, vigorous research and development have been conducted for laminate type EL devices.

However, in the EL device of this type, since thin films of 0.1 $\mu$m or less are formed in plural vapor deposition steps, pinholes are liable to be formed and it is necessary to control the film thickness under strictly controlled conditions in order to obtain a sufficient performance. Accordingly, there is a problem that the productivity is low and increase of the area is difficult. Further, since the EL device is driven at a high current density of several mA/cm$^2$, a great amount of Joule heat is generated. Therefore, a phenomenon is often observed that the hole transporting low molecular weight compound or the fluorescent organic low molecular compound formed as films by vapor deposition in an amorphous glass state is gradually crystallized and finally melted to lower the brightness or result in insulation breakdown and, as a result, the life time of the device is lowered.

Hence, there has been reported of using a star burst amine capable of providing a stable amorphous glass state as the hole transporting material (Extended Abstracts (The 40th Meeting, 1993); The Japan Society of Applied Physics, 30a-SZK-14, 1993), or using a polymer formed by introducing a triphenyl amine to the side chain of polyphosphazene (Pretext for The 42nd Symposium on Macromolecules, 20J 21 (1993)) for solving the problems in view of the heat stability of EL devices. However, since an energy barrier caused by ionizing potential of the hole transporting material is present, they cannot satisfy by themselves the hole chargeability form the anode or the hole chargeability to the light emitting layer. Further, in the former case of using the star burst amine, purification is difficult due to the low solubility and it is difficult to enhance the impurity, and the latter polymer cannot provide high current density to obtain a sufficient brightness.

On the other hand, research and development have also been progressed also on the EL devices of a single layer structure intending to solve the problems described above and devices formed by using conductive polymers such as poly(p-phenylene vinylene) (Nature Vol. 357, pp. 477–479, 1992) or mixing an electron transporting material and a fluorescent dye in hole transporting polyvinyl carbazole (Extended Abstracts (The 38th Meeting, 1991); The Japan Society of Applied Physics, 31p–G12, 1991) have been proposed but they are not yet comparable with the laminate type EL devices using the organic low molecular weight compound in view of the brightness and the luminous efficacy.

SUMMARY OF THE INVENTION

This invention has been made in view of overcoming the foregoing problems in the relatedr art, and this invention intends to provide an organic electroluminescence device easy to manufacture, having satisfactory brightness and excellent in durability.

The present inventors have made an earnest study on hole transporting polymers for solving the foregoing and, as a result, have accomplished this invention, based on the finding that a hole transporting polyester including, as a partial structure, at least one member selected from the structures shown by the following structural formulae I-(1) and I-(2) has a favorable hole charging property, a hole mobility and thin film forming performance, which is suitable as an organic electrtoluminescent device.

An aspect of the present invention provides an organic electroluminescence device having one or plural organic compound layers put between a pair of electrodes including an anode and a cathode one of which is transparent or semitransparent, wherein at least one of the organic compound layers contains one or more kinds of hole transporting polyesters including a repeating unit containing, as a partial structure, at least one member selected from structures represented by the following general formulae (I-1) and (I-2):

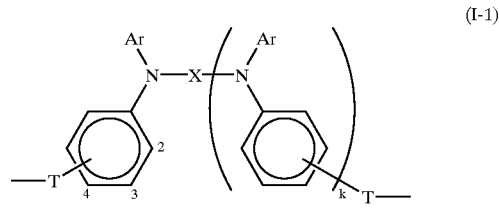

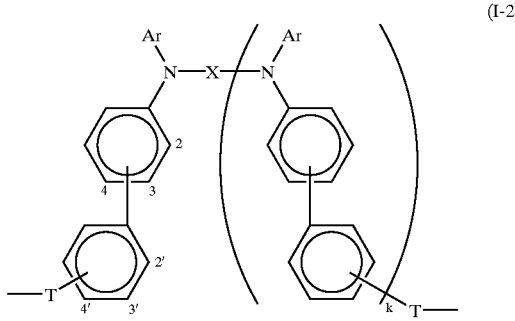
(I-2)

where Ar represents a substituted or unsubstituted monovalent polynuclear aromatic ring having a number of aromatic rings of from 3 to 10, or a substituted or unsubstituted monovalent condensed aromatic ring having a number of aromatic rings of from 2 to 10, X represents a substituted or unsubstituted bivalent aromatic group, T represents a bivalent linear hydrocarbon group of 1 to 6 carbon atoms or a bivalent branched hydrocarbon group of 2 to 10 carbon atoms and k represents 0 or 1.

An organic electroluminescence device according to another aspect of the present invention, has a hole transporting layer containing one or more hole transporting polyesters including repeating units containing, as a partial structure, at least one member selected from structures represented by the general formulae (I-1) and (I-2), and a luminescent layer as the organic compound layer in this order on a transparent electrode.

In an organic electroluminescence device according to another aspect of the present invention, the organic compound layer is a single layer.

In an organic electroluminescence device according to another aspect of the present invention, the organic compound layer contains at least one of a luminescent material, a hole transporting material and an electron transporting material.

In an organic electroluminescence device according to another aspect of the present invention, the hole transporting polyester is a polyester represented by the following general formula (I) or (III):

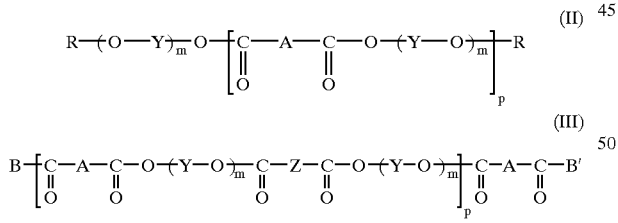

where A represents at least one member of the structures represented by the general formula (I-1) and (I-2), R represents a hydrogen atom, an alkyl group, a substituted or unsubstituted aryl group or a substituted or unsubstituted aralkyl group, Y represents a bivalent alcohol residue, Z represents a bivalent carboxylic residue, B and B' each represents, independently, —O—(Y—O)$_m$—R or —O—(Y—O—)$_m$—CO—Z—CO—OR' (in which R, Y and Z have, respectively, the same meanings as above and R' represents an alkyl group, a substituted or unsubstituted aryl group or a substituted or unsubstituted aralkyl group and m represents an integer of 1 to 5), m represents an integer of 1 to 5 and p represents an integer of from 5 to 5000.

BRIEF DESCRIPTION OF THE DRAWINGS

Preferred embodiments of this invention will be described in details based on the followings, wherein.

DETAILED DESCRIPTION OF THE PREFERRED EMBODIMENTS

Figure 1:
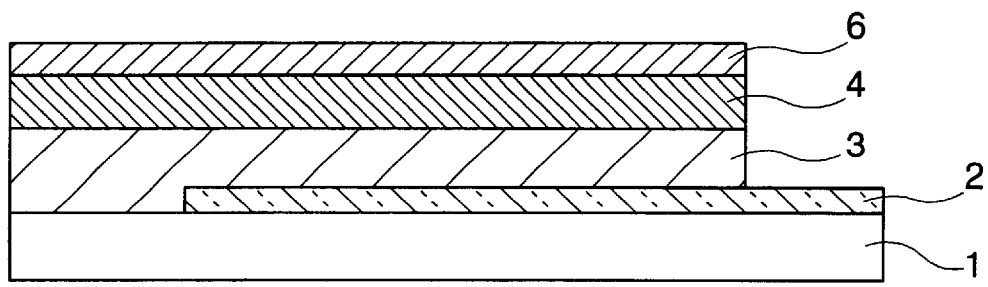
FIG. 1 is a schematic cross sectional view illustrating an example of an organic electroluminescence device according to this invention.

This invention is to be explained more specifically.

The organic electroluminescence device according to this invention has one or plural organic compound layers between a pair of electrodes and, optionally, has other layers and materials.

In the case where the organic compound layer includes a single layer, it contains one or more hole transporting polyesters defined above and, in the case where it includes two or more layers, it contains one or more of the hole transporting polyesters defined above in at least one layer.

The hole transporting polyester described above used in this invention includes repeating units containing, as a partial structure, at least one member selected from the structures represented by the general formulae I-(1) and I-(2).

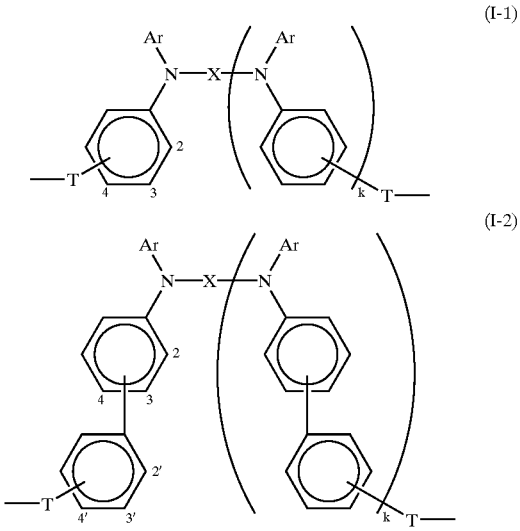

where Ar represents a substituted or unsubstituted monovalent polynuclear aromatic ring having a number of aromatic rings of from 3 to 10, or a substituted or unsubstituted monovalent condensed aromatic ring having a number of aromatic rings of from 2 to 10.

The substituent for the polynuclear aromatic ring or the condensed aromatic ring can include, for example, a hydrogen atom, an alkyl group, an alkoxy group, an aryl group, an aralkyl group, a substituted amino group, and a halogen atom. The alkyl group preferably has from 1 to 10 carbon atoms and can include, for example, methyl group, ethyl group, propyl group or isopropyl group. The alkoxy group preferably has 1 to 10 carbon atoms and can include, for example, methoxy group, ethoxy group, propoxy group and iropropoxy group. The aryl group preferably has 6 to 20 carbon atoms and can include, for example, phenyl group and toluyl group. The aralkyl group preferably has 7 to 20 carbon atoms and can include, for example, benzyl group and phenethyl group. The substituent for the substituted amino group can include, for example, alkyl group, aryl group and aralkyl group and the specific examples are as described above.

In the general formulae (I-1) and (I-2), X represents a substituted or unsubstituted bivalent aromatic group and, specifically, can include groups selected from the following formulae (1) to (7).

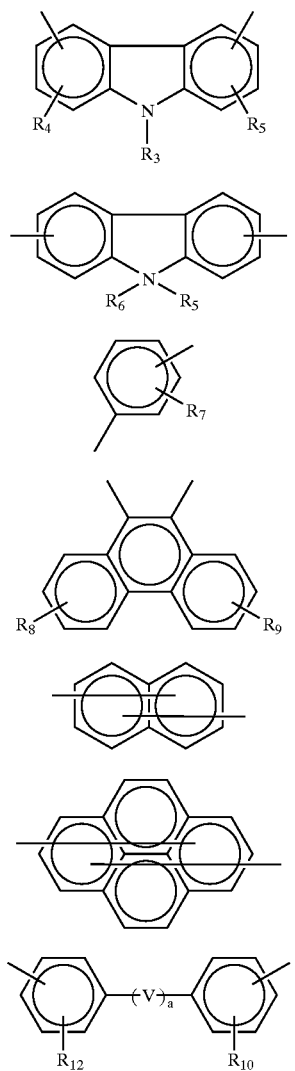

In the formulae (1) to (7), $R_3$ represents a hydrogen atom, an alkyl group of 1 to 4 carbon atoms, a substituted or unsubstituted phenyl group or a substituted or unsubstituted aralkyl group, $R_4$ to $R_{10}$ each represents, independently, a hydrogen atom, an alkyl group of 1 to 4 carbon atoms, an alkoxy group of 1 to 4 carbon atoms, a substituted or unsubstituted phenyl group, a substituted or unsubstituted aralkyl group or a halogen atom, a represents 0 or 1 and V represents the group selected from the following formulae (8) to (17).

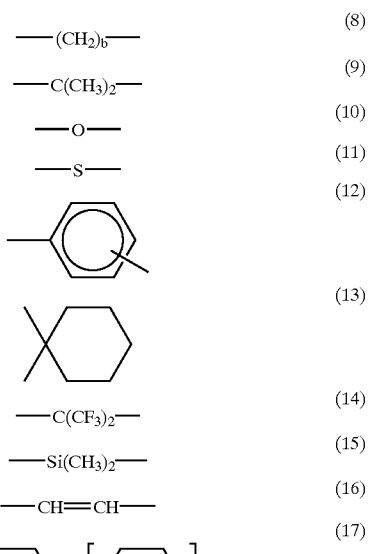

In the formulae (8) to (17), b represents an integer of 1 to 10 and c represents an integer of 1 to 3.

In the hole transporting polyester of this invention, it is particularly preferred that when X has a biphenylene structure represented by the following structural formulae (A) or (B), since a polymer of high mobility can be obtained as reported also in "The Sixth International Congress on Advances in Non-impact Printing Technologies", pp. 306–311, 1990.

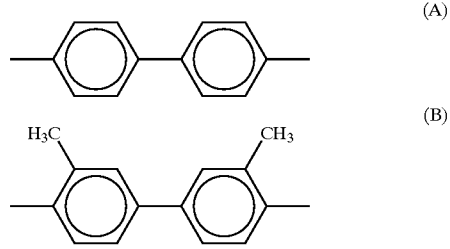

In the general formulae (I-1) and (I-2), T represents a bivalent linear hydrocarbon group of 1 to 6 carbon atoms or a bivalent branched hydrocarbon group of 2 to 10 carbon atoms, and is selected, preferably, from a bivalent linear hydrocarbon group of 2 to 6 carbon atoms and a bivalent branched hydrocarbon group of 3 to 7 carbon atoms. Preferred specific structures are shown below, with no particular restriction to them.

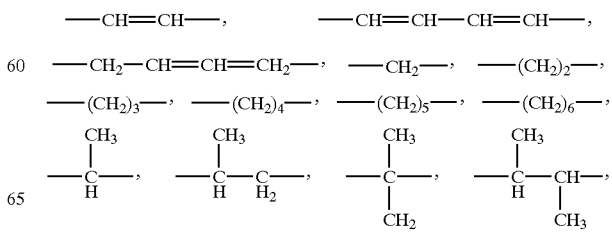

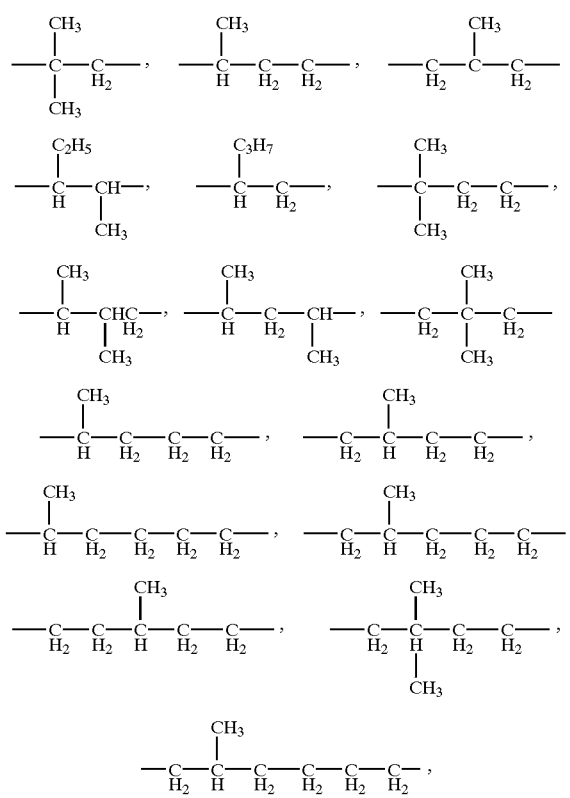
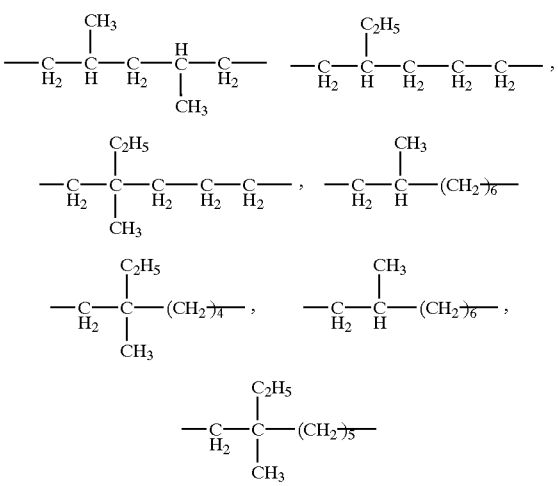
The following Table 1 shows specific examples of the structure represented by the general formula (I-1) and the following Table 2 show specific examples of the structures represented by the general formula (I-2) with no particular restriction to them. In the following table, B.P. means a bonded position.
TABLE 1
| No. | k | X | Ar | B.P. | T |
|---|---|---|---|---|---|
| 1 | 0 | 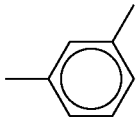 | 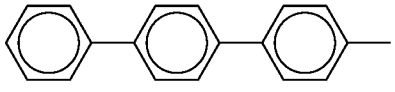 | 3 | —CH₂CH₂— |
| 2 | 0 |  | 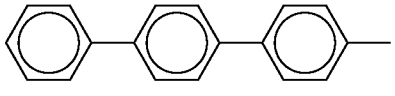 | 2 | —CH₂CH₂— |
| 3 | 0 |  | 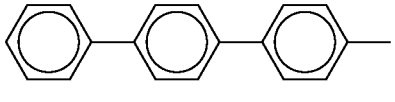 | 3 | —CH₂CH₂— |
| 4 | 0 |  | 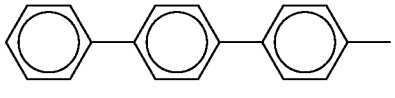 | 4 | —CH₂CH₂— |
| 5 | 0 |  | 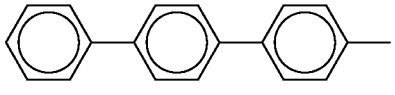 | 4 | 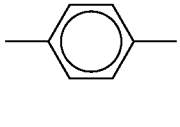 |
| 6 | 0 | | 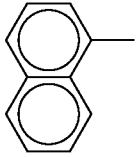 | 4 | |

TABLE 1-continued

| No. | k | X | Ar | B.P. | T |
|---|---|---|---|---|---|
| 7 | 0 | phenyl | naphthyl (2 rings) | 4 | —CH₂CH₂— |
| 8 | 1 | biphenyl | naphthyl (2 rings) | 4 | —CH₂— |
| 9 | 1 | biphenyl | anthryl (3 rings) | 4 | —CH₂CH₂— |
| 10 | 1 | biphenyl | terphenyl | 2 | —CH₂CH₂— |
| 11 | 1 | biphenyl | terphenyl | 2 | —CH₂— |
| 12 | 1 | biphenyl | terphenyl | 3 | —CH₂CH₂CH₂CH₂— |
| 13 | 1 | biphenyl | naphthyl (2 rings) | 3 | —CH₂CH₂— |
| 14 | 1 | biphenyl | naphthyl (2 rings) | 4 | —CH₂CH₂— |
| 15 | 1 | biphenyl | anthryl (3 rings) | 3 | —CH₂CH₂— |

TABLE 1-continued
| No. | k | X | Ar | B.P. | T |
|---|---|---|---|---|---|
| 16 | 1 | 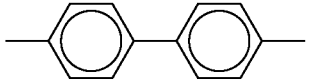 | 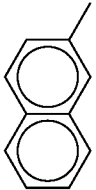 | 4 | —CH$_2$CH$_2$— |
| 17 | 1 | 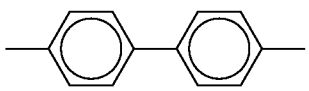 | 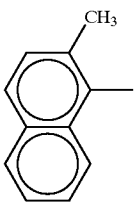 | 4 | —CH$_2$CH$_2$— |
| 18 | 1 | 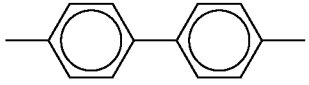 | 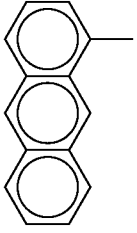 | 4 | —CH$_2$CH$_2$— |
| 19 | 1 | 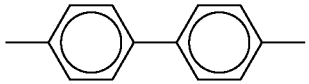 | 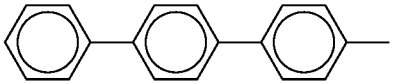 | 3 | —CH$_2$CH$_2$— |
| 20 | 1 | 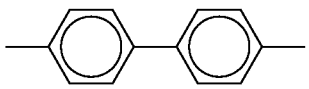 | 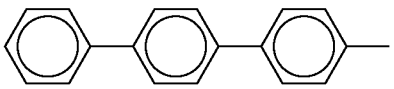 | 4 | —CH$_2$CH$_2$— |
| 21 | 1 | 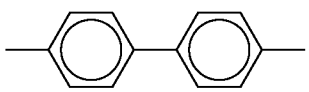 | 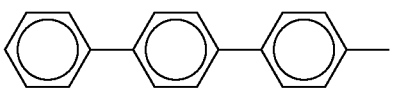 | 3 | 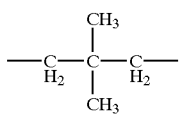 |
| 22 | 1 | 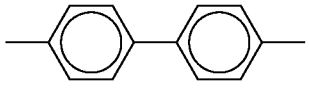 | 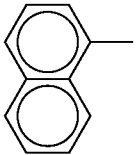 | 3 | 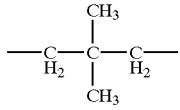 |
| 23 | 1 | 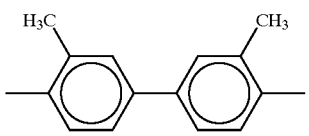 | 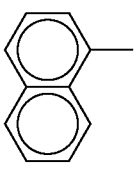 | 3 | —CH$_2$CH$_2$— |
| 24 | 1 | 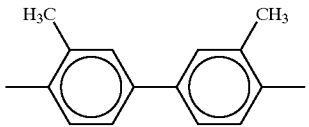 |  | 3 | —CH$_2$CH$_2$— |

TABLE 1-continued

| No. | k | X | Ar | B.P. | T |
|---|---|---|---|---|---|
| 25 | 1 | 3,3'-dimethyl-4,4'-biphenylene | 2-methyl-6-naphthyl | 4 | —CH$_2$CH$_2$— |
| 26 | 1 | 3,3'-dimethyl-4,4'-biphenylene | 2,3-dimethyl-6-naphthyl | 4 | —CH$_2$CH$_2$— |
| 27 | 1 | 3,3'-dimethyl-4,4'-biphenylene | 4,4''-p-terphenylene | 3 | —CH$_2$CH$_2$— |
| 28 | 1 | 3,3'-dimethyl-4,4'-biphenylene | 2,6-naphthylene | 4 | —CH$_2$CH$_2$— |
| 29 | 1 | 3,3'-dimethyl-4,4'-biphenylene | 3-methyl-2,6-naphthylene | 4 | —CH$_2$CH$_2$— |
| 30 | 1 | 3,3'-dimethyl-4,4'-biphenylene | 4,4''-p-terphenylene | 4 | —CH$_2$CH$_2$— |
| 31 | 1 | 3,3'-dimethyl-4,4'-biphenylene | 4,4''-p-terphenylene | 4 | —CH$_2$C(CH$_3$)$_2$CH$_2$— |
| 32 | 1 | 3,3'-dimethoxy-4,4'-biphenylene | 4,4''-p-terphenylene | 4 | —CH$_2$CH$_2$— |
| 33 | 1 | 3,3'-dimethoxy-4,4'-biphenylene | 2,6-naphthylene | 4 | —CH$_2$CH$_2$— |

TABLE 1-continued

| No. | k | X | Ar | B.P. | T |
|-----|---|---|-----|------|---|
| 34 | 1 | (biphenyl with H₃CO and OCH₃ substituents) | (naphthyl) | 4 | —CH₂CH₂— |
| 35 | 1 | (9,9-dimethylfluorene) | (terphenyl) | 4 | —CH₂CH₂— |
| 36 | 1 | (9,9-dimethylfluorene) | (naphthyl) | 4 | —CH₂CH₂— |
| 37 | 1 | (9,9-dimethylfluorene isomer) | (naphthyl) | 4 | —CH₂CH₂— |
| 38 | 1 | (pyrene) | (terphenyl) | 4 | —CH₂CH₂— |
| 39 | 1 | (terphenyl) | (naphthyl) | 4 | —CH₂— |
| 40 | 1 | (quaterphenyl) | (anthryl) | 4 | —CH₂CH₂— |
| 41 | 1 | (sexiphenyl) | | 2 | —CH₂CH₂— |
| 42 | 1 | (sexiphenyl) | | 2 | —CH₂— |

TABLE 1-continued
| No. | k | X | Ar | B.P. | T |
|---|---|---|---|---|---|
| 43 | 1 | 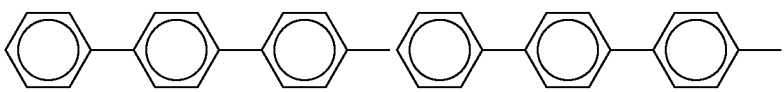 | | 3 | —CH$_2$CH$_2$CH$_2$CH$_2$— |
| 44 | 1 | 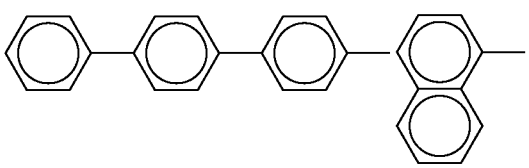 | | 3 | —CH$_2$CH$_2$— |
| 45 | 1 | 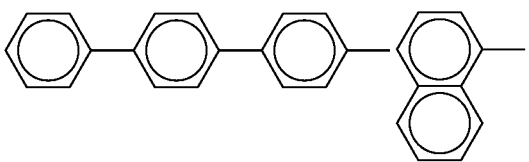 | | 4 | —CH$_2$CH$_2$— |
| 46 | 1 | 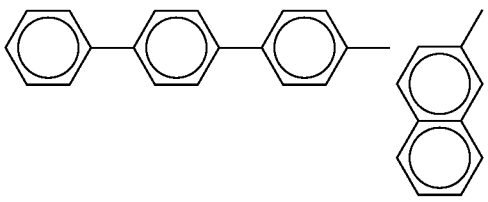 | | 3 | —CH$_2$CH$_2$— |
| 47 | 1 | 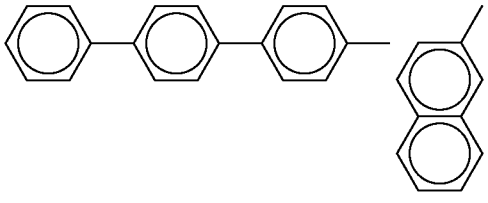 | | 4 | —CH$_2$CH$_2$— |
| 48 | 1 | 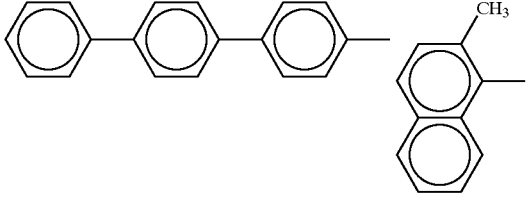 | | 4 | —CH$_2$CH$_2$— |
| 49 | 1 | 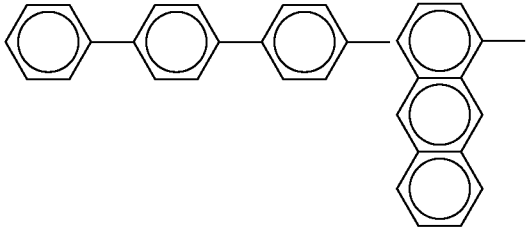 | | 4 | —CH$_2$CH$_2$— |
| 50 | 1 | 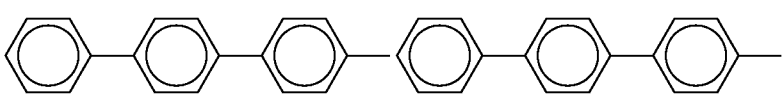 | | 3 | —CH$_2$CH$_2$— |
| 51 | 1 | 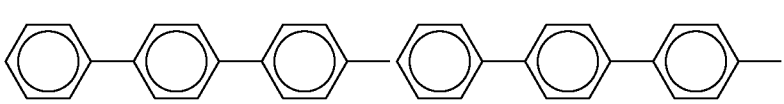 | | 4 | —CH$_2$CH$_2$— |

TABLE 1-continued

| No. | k | X | Ar | B.P. | T |
|-----|---|---|----|------|---|
| 52 | 1 | (phenyl-phenyl-phenyl) | (phenyl-phenyl-phenyl-) | 3 | —CH₂—C(CH₃)₂—CH₂— |
| 53 | 1 | (phenyl-phenyl-phenyl) | (naphthyl-) | 3 | —CH₂—C(CH₃)₂—CH₂— |
| 54 | 0 | (dimethylphenyl) | (phenyl-phenyl-phenyl-) | 4, 4' | —CH₂CH₂— |
| 55 | 0 | (phenyl) | (phenyl-phenyl-phenyl-) | 4, 4' | —CH₂CH₂— |
| 56 | 0 | (phenyl) | (naphthyl-) | 4, 4' | —CH₂CH₂— |
| 57 | 0 | (phenyl) | (naphthyl-) | 4, 4' | —CH₂CH₂— |
| 58 | 0 | (phenyl) | (anthryl-) | 4, 4' | —CH₂CH₂— |
| 59 | 0 | (biphenyl) | (phenyl-phenyl-phenyl-) | 4, 4' | —CH₂— |
| 60 | 0 | (biphenyl) | (phenyl-phenyl-phenyl-) | 4, 4' | —CH₂CH₂— |
| 61 | 0 | (biphenyl) | (naphthyl-) | 4, 4' | —CH₂— |

TABLE 1-continued
| No. | k | X | Ar | B.P. | T |
|---|---|---|---|---|---|
| 62 | 0 | 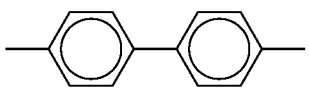 | 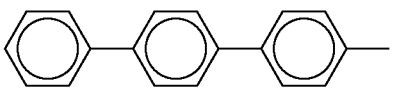 | 4, 4' | 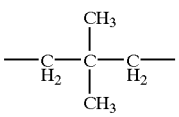 |
| 63 | 0 | 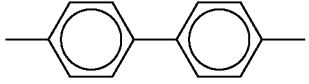 | 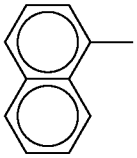 | 4, 4' | 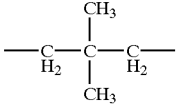 |
| 64 | 1 | 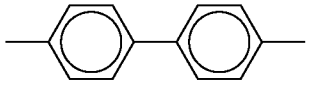 | 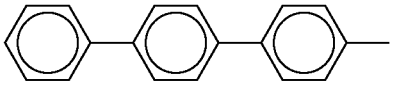 | 4, 4' | —CH$_2$— |
| 65 | 1 | 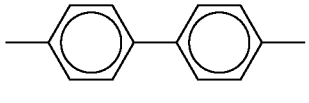 | 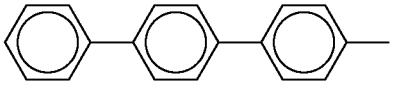 | 4, 4' | —CH$_2$CH$_2$— |
| 66 | 1 | 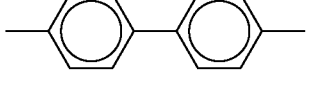 | 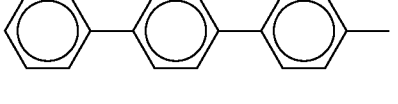 | 4, 4' | —CH$_2$CH$_2$CH$_2$CH$_2$— |
| 67 | 1 |  |  | 4, 4' | 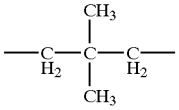 |
| 68 | 1 | 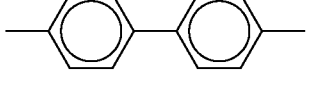 | 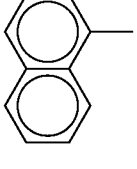 | 4, 4' | —CH$_2$— |
| 69 | 1 | 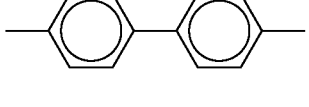 | 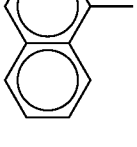 | 4, 4' | —CH$_2$CH$_2$— |
| 70 | 1 | 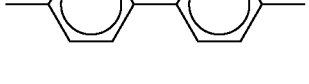 |  | 4, 4' | —CH$_2$CH$_2$— |
| 71 | 1 | 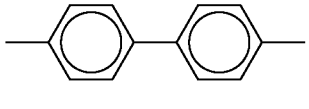 | 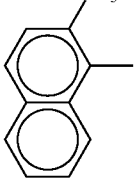 | 4, 4' | —CH$_2$CH$_2$— |

TABLE 1-continued

| No. | k | X | Ar | B.P. | T |
|---|---|---|---|---|---|
| 72 | 1 | 4,4'-biphenylene | anthracenyl | 4, 4' | —CH$_2$CH$_2$— |
| 73 | 1 | 3,3'-dimethyl-4,4'-biphenylene | 4,4'-terphenylene | 4, 4' | —CH$_2$CH$_2$— |
| 74 | 1 | 3,3'-dimethyl-4,4'-biphenylene | 4,4'-terphenylene | 4, 4' | —C(CH$_3$)(CH$_3$)— with —CH$_2$— on each side |
| 75 | 1 | 3,3'-dimethyl-4,4'-biphenylene | naphthyl | 4, 4' | —CH$_2$CH$_2$— |
| 76 | 1 | 3,3'-dimethyl-4,4'-biphenylene | naphthyl (with CH$_3$) | 4, 4' | —CH$_2$CH$_2$— |
| 77 | 1 | 3,3'-dimethyl-4,4'-biphenylene | methylnaphthyl | 4, 4' | —CH$_2$CH$_2$— |
| 78 | 1 | 3,3'-dimethoxy-4,4'-biphenylene | 4,4'-terphenylene | 4, 4' | —CH$_2$CH$_2$— |
| 79 | 1 | 3,3'-dimethoxy-4,4'-biphenylene | naphthyl | 4, 4' | —CH$_2$CH$_2$— |

TABLE 1-continued

| No. | k | X | Ar | B.P. | T |
|---|---|---|---|---|---|
| 80 | 1 | 3,3'-dimethoxy-biphenyl-4,4'-diyl | naphthalen-2-yl | 4, 4' | —CH$_2$CH$_2$— |
| 81 | 1 | 9,9-dimethylfluorene-2,7-diyl | p-terphenyl-4,4''-diyl | 4, 4' | —CH$_2$CH$_2$— |
| 82 | 1 | 9,9-dimethylfluorene-2,7-diyl | naphthalen-1-yl | 4, 4' | —CH$_2$CH$_2$— |
| 83 | 1 | 9,9-dimethylfluorene-2,7-diyl | naphthalen-2-yl | 4, 4' | —CH$_2$CH$_2$— |
| 84 | 1 | pyrene-1,6-diyl | p-terphenyl-4,4''-diyl | 4, 4' | —CH$_2$CH$_2$— |
| 85 | 0 | — | p-sexiphenyl-4,4'''''-diyl | 4, 4' | —CH$_2$— |
| 86 | 0 | — | p-sexiphenyl-4,4'''''-diyl | 4, 4' | —CH$_2$CH$_2$— |
| 87 | 0 | — | 4-(p-terphenyl-4-yl)naphthalen-1-yl | 4, 4' | —CH$_2$— |
| 88 | 0 | — | p-sexiphenyl-4,4'''''-diyl | 4, 4' | —CH$_2$C(CH$_3$)$_2$CH$_2$— |

TABLE 1-continued
| No. | k | X | Ar | B.P. | T |
|---|---|---|---|---|---|
| 89 | 0 | | 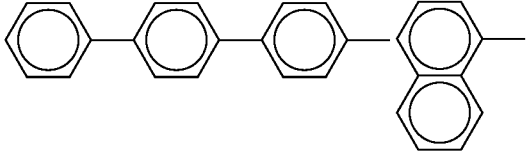 | 4, 4' | 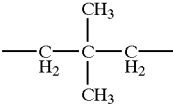 |
| 90 | 1 | | 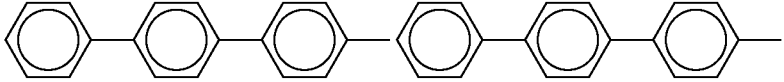 | 4, 4' | —CH$_2$— |
| 91 | 1 | | 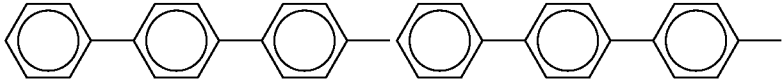 | 4, 4' | —CH$_2$CH$_2$— |
| 92 | 1 | | 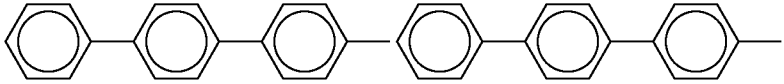 | 4, 4' | —CH$_2$CH$_2$CH$_2$— |
| 93 | 1 | | 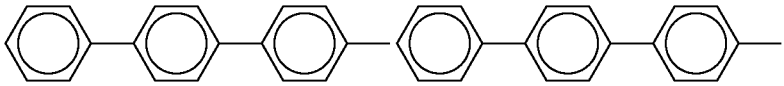 | 4, 4' | 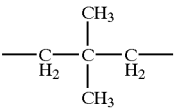 |
| 94 | 1 | | 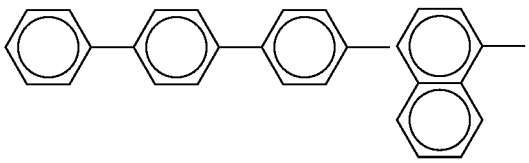 | 4, 4' | —CH$_2$— |
| 95 | 1 | | 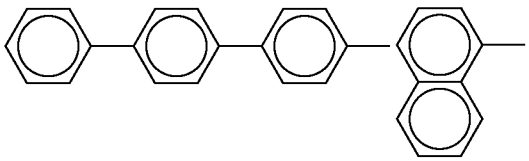 | 4, 4' | —CH$_2$CH$_2$— |
| 96 | 1 | | 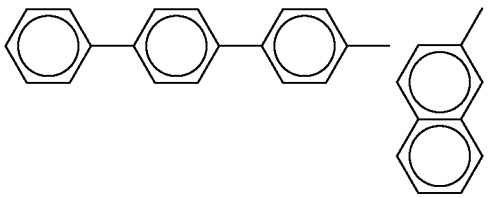 | 4, 4' | —CH$_2$CH$_2$— |
| 97 | 1 | | 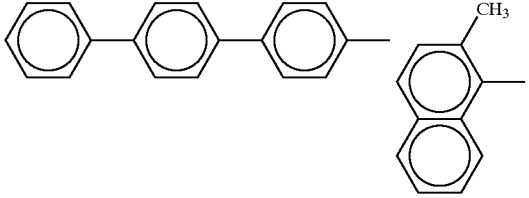 | 4, 4' | —CH$_2$CH$_2$— |

TABLE 1-continued

| No. | k | X | Ar | B.P. | T |
|-----|---|---|----|----|---|
| 98 | 1 | 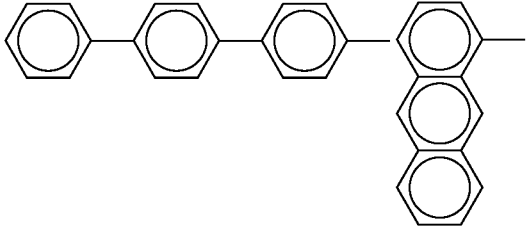 | | 4, 4' | —CH$_2$CH$_2$— |

In this invention, as the hole transporting polyester, those represented by the following general formula (II) or (III) are used suitably.

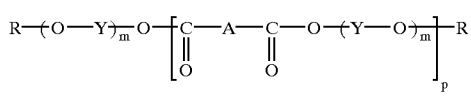  (II)

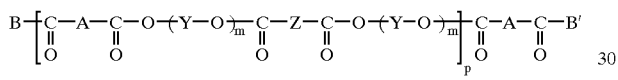  (III)

where A represents at least one member selected from the structures represented by the general formulae (I-1) and (I-2), which may contain two or more kinds of A in one polymer.

In the formula, R represents a hydrogen atom, an alkyl group, a substituted or unsubstituted aryl group or a substituted or unsubstituted aralkyl group.

The alkyl group preferably has 1 to 10 carbon atoms and can include, for example, methyl group, ethyl group, propyl group and isopropyl group. The aryl group preferably has 6 to 20 carbon atoms and can include, for example, phenyl group and toluyl group. The aralkyl group preferably has 7 to 20 carbon atoms and can include, for example, benzyl group and phenethyl group. Further, the substituent for the substituted aryl group or the substituted aralkyl group can include, for example, a hydrogen atom, an alkyl group, an alkoxy group, substituted amino group and a halogen atom.

In the formula, Y represents a bivalent alcohol residue and Z represents bivalent carboxylic residue. Y and Z can include specifically groups selected from the following formulae (18) to (24), with no particular restriction to them.

—(CH$_2$)$_d$—  (18)

—(CH$_2$CH$_2$O)$_e$—(CH$_2$CH$_2$)—  (19)

  (20)

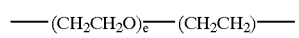  (21)

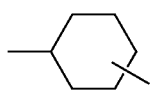  (22)

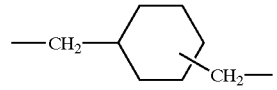  (22)

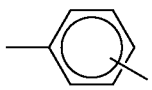

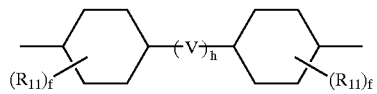  (23)

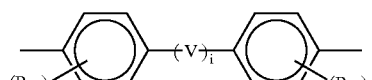  (24)

In the formulae (18) to (24), R$_{11}$ and R$_{12}$ each represents, independently, a hydrogen atom, an alkyl group of 1 to 4 carbon atoms, an alkyl group of 1 to 4 carbon atoms, a substituted or unsubstituted phenyl group, a substituted or unsubstituted aralkyl group or a halogen atom, d and e each represents, independently, an integer of 1 to 10, f and g each represents, independently, an integer 0 to 2, h and i each represents, independently, 0 or 1 and V has the same meanings as described above.

In the general formula (m), B and B' each represents, independently, —O—(Y—O)$_m$—R or —O—(Y—O—)$_m$—CO—Z—CO—OR'. R, Y and Z have, respectively, the same meanings as above and R' represents an alkyl group, a substituted or unsubstituted aryl group or a substituted or unsubstituted aralkyl group and m represents an integer of 1 to 5.

In the general formulae (II) and (III), m represents an integer of 1 to 5 and p represents an integer of 5 to 5000. p is preferably within a range from 10 to 1000.

The following Table 2 show specific examples of the hole transporting polyesters represented by the general formula (II) or (III) with no particular restriction to them. In Table 2, numbers for the structures A correspond to the numbers for the structures in Table 1.

TABLE 2
| No. | A Ratio | Y | Z | m | p |
|---|---|---|---|---|---|
| (1) | 1 | —CH₂CH₂— | — | 1 | 97 |
| (2) | 2 | —CH₂CH₂— | — | 1 | 92 |
| (3) | 4 | —CH₂CH₂— | — | 1 | 101 |
| (4) | 4 | —CH₂CH₂— |  | 1 | 100 |
| (5) | 4 | —CH₂CH₂— |  | 1 | 95 |
| (6) | 4 | —CH₂CH₂— |  | 2 | 58 |
| (7) | 4 | 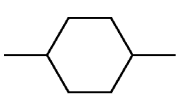 | — | 1 | 110 |
| (8) | 4 | 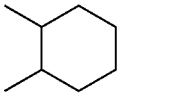 | —(CH₂)₄— | 1 | 88 |
| (9) | 4 | 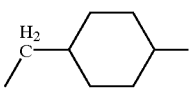 | — | 1 | 65 |
| (10) | 5 | —CH₂CH₂— | — | 1 | 85 |
| (11) | 5 | —CH₂CH₂— | — | 1 | 98 |
| (12) | 6 | —CH₂CH₂— | — | 1 | 110 |
| (13) | 7 | —CH₂CH₂— |  | 2 | 80 |
| (14) | 8 | —CH₂CH₂— | —(CH₂)₄— | 1 | 97 |
| (15) | 14 | —CH₂CH₂— | — | 1 | 140 |
| (16) | 14 | —(CH₂)₄— |  | 2 | 135 |
| (17) | 14 |  | — | 1 | 120 |
| (18) | 14 |  | — | 1 | 95 |
| (19) | 14 | 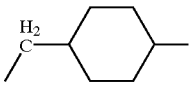 | 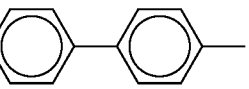 | 1 | 105 |
| (20) | 10 | —CH₂CH₂— | — | 1 | 75 |
| (21) | 11 | —CH₂CH₂— |  | 1 | 40 |

TABLE 2-continued

| No. | A Ratio | Y | Z | m | p |
|---|---|---|---|---|---|
| (22) | 12 | — | cyclohexyl-1,4 | — | 1 | 69 |
| (23) | 13 | — | cyclohexyl-1,2 | — | 1 | 84 |
| (24) | 9 | — | —CH₂—cyclohexyl—CH₂— | biphenyl | 1 | 98 |
| (25) | 15 | — | —CH₂CH₂— | — | 1 | 115 |
| (26) | 20 | — | —CH₂CH₂— | — | 1 | 123 |
| (27) | 20 | — | —CH₂CH₂— | phenyl | 1 | 105 |
| (28) | 20 | — | cyclohexyl-1,4 | — | 1 | 100 |
| (29) | 20 | — | cyclohexyl-1,2 | — | 1 | 98 |
| (30) | 22 | — | —CH₂—cyclohexyl—CH₂— | biphenyl | 1 | 95 |
| (31) | 23 | — | —CH₂CH₂— | — | 1 | 70 |
| (32) | 23 | — | —CH₂CH₂— | phenyl | 1 | 88 |
| (33) | 29 | — | —CH₂CH₂— | — | 1 | 60 |
| (34) | 30 | — | —CH₂CH₂— | — | 1 | 84 |
| (35) | 31 | — | —CH₂CH₂— | — | 1 | 100 |
| (36) | 32 | — | —CH₂CH₂— | — | 1 | 75 |
| (37) | 33 | — | —CH₂CH₂— | — | 1 | 80 |
| (38) | 34 | — | —CH₂CH₂— | — | 1 | 68 |
| (39) | 35 | — | —CH₂CH₂— | — | 1 | 90 |
| (40) | 36 | — | —CH₂CH₂— | — | 1 | 106 |
| (41) | 37 | — | —CH₂CH₂— | — | 1 | 105 |
| (42) | 54 | — | —CH₂CH₂— | — | 1 | 93 |
| (43) | 56 | — | —CH₂CH₂— | — | 1 | 80 |
| (44) | 37 | — | —CH₂CH₂— | 1,3-phenyl | 1 | 65 |
| (45) | 55 | — | —(CH₂)₄— | —(CH₂)₄— | 1 | 80 |
| (46) | 37 | — | cyclohexyl-1,4 | — | 1 | 95 |
| (47) | 58 | — | —CH₂CH₂— | — | 1 | 73 |

TABLE 2-continued

| No. | A | Ratio | Y | Z | m | p |
|---|---|---|---|---|---|---|
| (48) | 58 | — | —CH₂CH₂'3 | [phenyl] | 1 | 100 |
| (49) | 58 | — | [cyclohexyl] | — | 1 | 65 |
| (50) | 59 | — | —CH₂CH₂— | — | 1 | 80 |
| (51) | 60 | — | —CH₂CH₂'3 | — | 1 | 110 |
| (52) | 61 | — | [cyclohexyl] | — | 1 | 107 |
| (53) | 62 | — | [1,2-cyclohexyl] | — | 1 | 63 |
| (54) | 64 | — | —CH₂CH₂'3 | — | 1 | 97 |
| (55) | 66 | — | —CH₂CH₂— | [phenyl] | 1 | 60 |
| (56) | 67 | — | [cyclohexyl] | — | 1 | 80 |
| (57) | 68 | — | [1,2-cyclohexyl] | — | 1 | 57 |
| (58) | 69 | — | —CH₂—[cyclohexyl]—CH₂— | [biphenyl] | 1 | 40 |
| (59) | 70 | — | —CH₂CH₂— | — | 1 | 95 |
| (60) | 70 | — | —CH₂CH₂— | [phenyl] | 1 | 80 |
| (61) | 70 | — | [cyclohexyl] | — | 1 | 100 |
| (62) | 70 | — | [1,2-cyclohexyl] | — | 1 | 82 |
| (63) | 71 | — | —CH₂—[cyclohexyl]—CH₂— | [biphenyl] | 1 | 65 |
| (64) | 4 | — | —CH₂—C(CH₃)₂—CH₂— | — | 1 | 65 |

TABLE 2-continued
| No. | Structure A Ratio | Y | Z | m | p |
|---|---|---|---|---|---|
| (65) | 30 — | 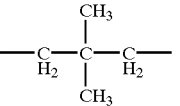 | — | 1 | 70 |
| (66) | 16 — |  | — | 1 | 82 |
| (67) | 18 — | —CH$_2$CH$_2$— | — | 1 | 90 |
| (68) | 20 — | —CH$_2$CH$_2$— | 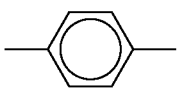 | 1 | 65 |
| (69) | 4/12 1/1 | —CH$_2$CH$_2$— | — | 1 | 50 |
| (70) | 4/12 1/1 | —CH$_2$CH$_2$— | — | 2 | 73 |
| (71) | 4/12 1/1 | 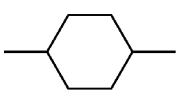 | 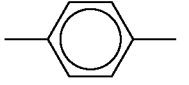 | 1 | 80 |
| (72) | 4/12 1/1 | —CH$_2$CH$_2$— | — | 1 | 72 |
| (73) | 4/30 1/1 | —CH$_2$CH$_2$— | — | 1 | 65 |
| (74) | 4/30 1/1 | —CH$_2$CH$_2$— | — | 2 | 80 |
| (75) | 4/31 1/1 | —CH$_2$CH$_2$— | — | 1 | 90 |
| (76) | 4/8/30 1/1/1 | —CH$_2$CH$_2$— | — | 1 | 65 |
| (77) | 8/30 1/1 | —CH$_2$CH$_2$— | — | 1 | 80 |
| (78) | 8/30 1/1 | —CH$_2$CH$_2$— | 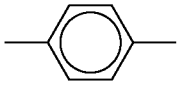 | 1 | 75 |
| (79) | 8/30 1/2 | —CH$_2$CH$_2$— | — | 1 | 65 |
| (80) | 8/30 2/1 | —CH$_2$CH$_2$— | — | 1 | 60 |
| (81) | 44 — | —CH$_2$CH$_2$— | — | 1 | 110 |
| (82) | 44 — | —CH$_2$CH$_2$'3 | 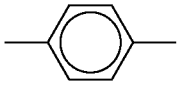 | 1 | 93 |
| (83) | 44 — | —CH$_2$CH$_2$— | 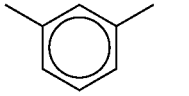 | 1 | 95 |
| (84) | 44 — | —CH$_2$CH$_2$— | 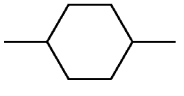 | 2 | 62 |
| (85) | 44 — |  | — | 1 | 88 |

TABLE 2-continued

| | | Structure | | | | |
|---|---|---|---|---|---|---|
| No. | A | Ratio | Y | Z | m | p |
| (86) | 44 | — | 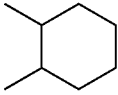 | —(CH$_2$)$_4$— | 1 | 72 |
| (87) | 44 | — | 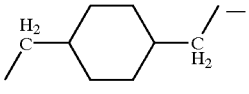 | | 1 | 89 |

The hole transporting polyester used in this invention has an average weight molecular weight Mw within a range from 10,000 to 300,000 and, preferably, from 10,000 to 300,000.

The hole transporting polyester defined above can be synthesized by polymerization of the hole transporting monomer represented by the following general formulae (I-3) and (I-4) by a known method, for example, described in 4th Experimental Chemistry Lecture, Vol. 26 (Maruzen, 1992):

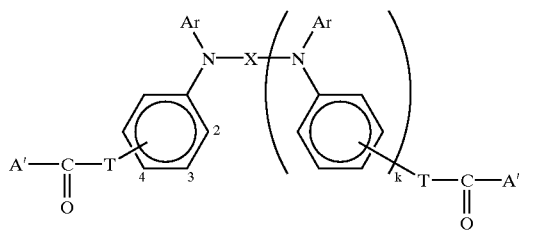

(I-3)

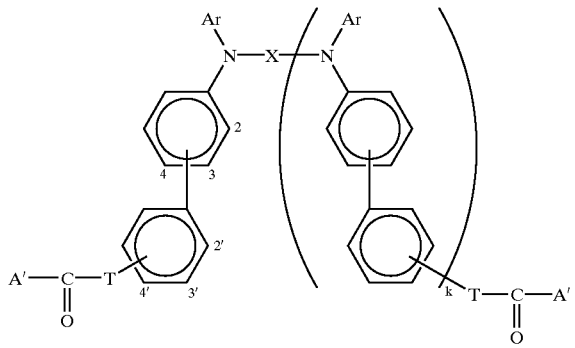

(I-4)

where Ar, X, T, k, respectively, have the same meanings as in the general formulae (I-1) and (I-2), A' represents a hydroxy group, a halogen atom or —O—R$_{13}$, and R$_{13}$ represents an alkyl group, a substituted or unsubstituted aryl group or a substituted or unsubstituted aralkyl group.

That is, the hole transporting polyester represented by the general formula (II) can be synthesized as described below.

In the case where A' represents a hydroxyl group, dihydric alcohols represented by HO—(Y—O)$_m$—H are mixed substantially in an equivalent amount and polymerized by using an acid catalyst. As the acid catalyst, those used for usual esterifying reaction such as sulfuric acid, toluene sulfonic acid or trifluoro acetic acid can be used, and used within a range from $\frac{1}{10,000}$ to $\frac{1}{10}$ parts by weight, preferably, $\frac{1}{1,000}$ to $\frac{1}{50}$ parts by weight based on one part by weight of the hole transporting monomer. A solvent capable of azeotropically boiling with water is used preferably for removing water that is formed during polymerization. As the solvent, trichloroethane, toluene, chlorobenzene, nitrobenzene and 1-chloronaphthalene are effective and it is used within a range from 1 to 100 parts by weight, preferably, from 2 to 50 parts by weight per one part by weight of the hole transporting monomer. The reaction temperature can be set optionally and it is preferred to react them at the boiling point of the solvent in order to remove water that is formed during polymerization.

After the completion of the reaction, the reaction product is dissolved into a solvent capable of dissolving the same in a case of not using the solvent. In the case of using the solvent, the reaction solution is dropped as it is in a poor solvent such as alcohols, for example, methanol or ethanol or acetone to which the hole polymer is less soluble, the hole transporting polyester is precipitated and the hole transporting polyester is separated and then thoroughly washed with water or an organic solvent and dried. Further, if necessary, re-precipitation treatment of dissolving the product into an appropriate organic solvent and dropping the same into a poor solvent to precipitate the hole transporting polyester may be repeated. The re-precipitation treatment is conducted preferably while stirring efficiently by using a mechanical stirrer or the like. The solvent for dissolving the hole transporting polyester in the re-precipitation treatment is used within a range from 1 to 100 parts by weight, preferably, from 2 to 50 parts by weigh per one part by weight of the hole transporting polyester. The poor solvent is used within a range from 1 to 1,000 parts by weight, preferably, from 10 to 500 parts by weight per one part by weight of the hole transporting polyester.

In the case where A' is a halogen atom, dihydric alcohols represented by HO—(Y—O)$_m$—H are mixed substantially by an equivalent amount and polymerized by using an organic basic catalyst such as pyridine or triethylamine. The organic basic catalyst is used within a range from 1 to 10 equivalent amount, preferably, 2 to 5 equivalent amount based on one equivalent amount of the hole transporting monomer. As the solvent, methylene chloride, tetrahydrofuran (THF), toluene, chlorobenzene and 1-chloronaphthalene are effective and used within a range from 1 to 100 parts by weight, preferably, 2 to 50 parts by weight based on one part by weight of the hole transporting monomer. The reaction temperature can be set optionally. After the polymerization, re-precipitation treatment is applied as described above to conduct purification.

In the case of using dihydric alcohols of high acidity such as bisphenol, an interface polymerization method can also be used. That is, after adding water to dihydric alcohols and dissolving them with addition of an equivalent amount of a base, polymerization can be conducted by adding dihydric alcohols and a solution of the hole transporting monomer in an equivalent amount under vigorous stirring. In this case, water is used within a range from 1 to 1,000 parts by weight, preferably, 2 to 500 parts by weight based on one part by weight of the dihydric alcohols. As the solvent for dissolving the hole transporting monomer, methylene chloride, dichloroethane, trichloroethane, toluene, chlorobenzene and 1-chloronaphthalene are effective. The reaction temperature can be set optionally and it is effective to use a phase transfer catalyst such as an ammonium salt or sulfonium salt for promoting the reaction. The phase transfer catalyst is used within a range from 0.1 to 10 parts by weight, preferably, 0.2 to 5 parts by weight based on one part by weight of the hole transporting monomer.

In the case where A' is —O—$R_{13}$, the polyester can be synthesized by adding dihydric alcohols represented by HO—(Y—O)$_m$—H in excess to the hole transporting monomer represented by the general formulae (I-3) and (I-4), heating them by using an inorganic acid such as sulfuric acid or phosphoric acid, titanium alkoxide, an acetate or carbonate of calcium or cobalt, an oxide of zinc or lead as the catalyst and by way of ester exchanging. The dihydric alcohols are used within a range form 2 to 100 equivalent amount, preferably, 3 to 50 equivalent amount based on one equivalent amount of the hole transporting monomer. The catalyst is used within a range from 1/10,000 to 1 part by weight, preferably, 1/1,000 to 1/2 parts by weight based on one part by weight of the hole transporting monomer. The reaction is conducted at a reaction temperature of 200 to 300° C. and, after the completion of ester exchange from the group-O—$R_{13}$ to the group-O—(Y—O)$_m$—H, the reaction is conducted preferably under a reduced pressure for promoting polymerization by dissociation of HO—(Y—O)$_m$—H. The reaction can also be conducted while removing HO—(Y—O)$_m$—H by azeotropic boiling under a normal pressure using a high boiling solvent such as 1-chloronaphthalene capable of azeotropically boiling with HO—(Y—O)$_m$—H.

Further, the hole transporting polyester represented by the general formula (III) can be synthesized as described below. After forming the compound represented by the following general formulae (I-5) and (I-6) by adding dihydric alcohols in excess and reacting them in each of the cases for synthesizing the hole transporting polyesters represented by the general formula (II), the compound may be used as the hole transporting monomer and reacted with dibasic carboxylic acid or the dibasic carboxylic acid halide by the same method as described above, by which a hole transporting polyester can be obtained.

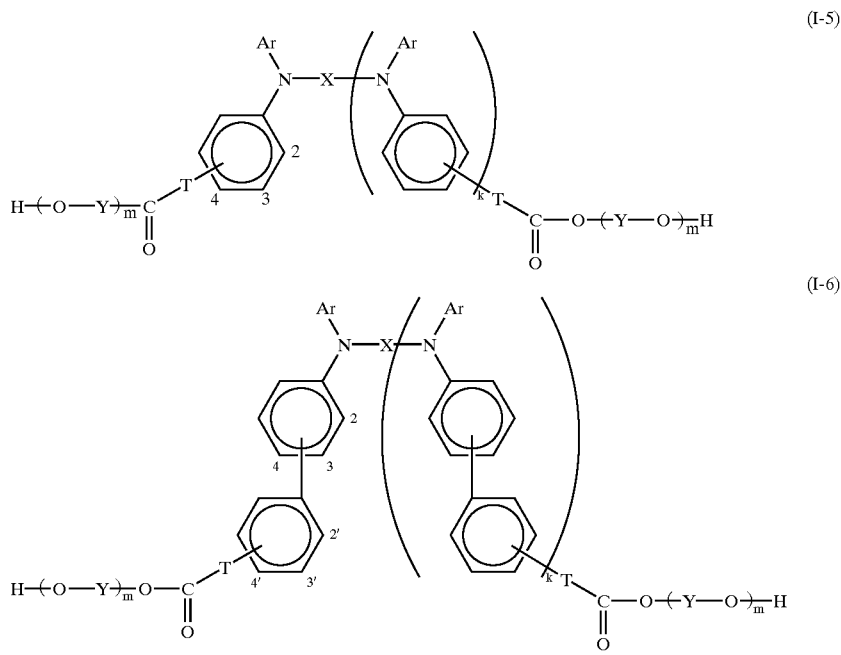

(I-5)

(I-6)

where Ar, X, Y, T, m and k are as described above.

Then, explanation is to be made to the layer constitution of the organic compound layer and a pair of electrodes in the organic EL device according to this invention. In this invention, when one organic compound layer is used, this organic compound layer means a luminescent layer having a carrier transporting property. Further, if plural organic compound layers are used, this means that one of them is a luminescent layer and other organic compound layers include a hole transporting layer and an electron transporting layer, or a hole transporting layer and an electron transporting layer.

Figure 2:
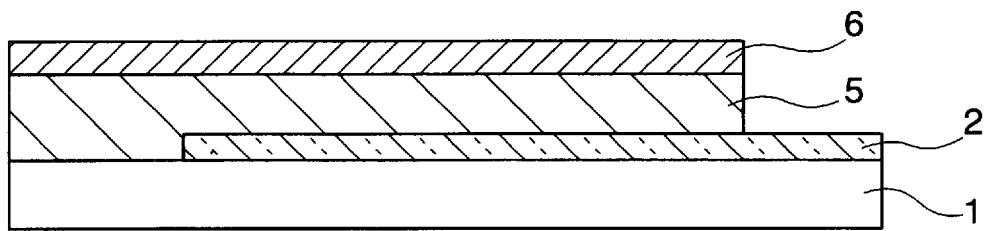
FIG. 2 is a schematic cross sectional view illustrating another example of an organic electroluminescence device according to this invention.

FIG. 1 and FIG. 2 are schematic cross sectional views for explaining examples of the layer constitution of organic electroluminescence devices according to this invention. This invention is not restricted to such layer constitutions. FIG. 1 is an example of using plural organic compound layers, in which a transparent electrode 2, a hole transporting layer 3, a luminescent layer 4 and a back electrode 6 are formed in this order on a transparent insulative substrate 1. FIG. 2 is an example of using one organic compound layer, in which a transparent electrode 2, a luminescent layer 5 having a hole transporting property and a back electrode 6 are disposed in this order on a transparent insulative substrate 1. The electrodes used in this invention may be a pair of electrodes including an anode and a cathode at least one of which is transparent or semitransparent.

The transparent insulative substrate 1 in FIG. 1 and FIG. 2 is preferably transparent for taking out emission of light, for which a glass or plastic film is used. "Transparent" means that the transmissivity for the light in the visible region is 10% or more and, preferably, 75% or higher.

The transparent electrode 2 in FIG. 1 and FIG. 2 is preferably transparent for taking out luminescence, like the transparent insulative substrate, and preferably has a large work function for injecting holes and those with a work function of 4 eV or more are preferred. Specifically, oxide films such as of tin indium oxide (ITO), tin oxide (NESA), indium oxide and zinc oxide, as well as vapor-deposited or sputtered gold, platinum or palladium are used. The electrode, preferably, has a sheet resistance as low as possible, with the resistance of several hundreds $\Omega/\square$ or less being preferred. Further, like the transparent insulative substrate, the transmissivity of light in the visible region is preferably 10% or more and, further preferably, 75% or more.

The organic compound layer containing the hole transporting polyester is the hole transporting layer 3 in the layer constitution of the organic EL device shown in FIG. 1, and is the luminescent layer 5 having the hole transporting property in the layer constitution of the organic EL device shown in FIG. 2. The luminescent layer 4 in FIG. 1 may contain the hole transporting polyester as well.

In the layer constitution of the organic EL device shown in FIG. 1, the hole transporting layer 3 may be formed solely of the hole transporting polyester but may be formed by dispersing a hole transporting material other than the hole transporting polyester within a range from 1% to 50% by weight for controlling the hole mobility. Such hole transporting material can include, for example, tetraphenylenediamine derivatives, triphenylamine derivatives, carbazole derivatives, stilbene derivatives, arylamine derivatives and porphyrin compounds, tetraphenylenediamine derivatives being particularly preferred. Further, it may be mixed with other general purpose resins.

For the luminescent layer 4 in FIG. 1, a compound showing high fluorescent quantum yield in a solid sate is used as the luminescent material. When the luminescent material is an organic low molecular weight material, it is a necessary condition that a favorable thin film can be formed by a vacuum vapor deposition method or by coating and drying a solution or liquid dispersion containing the low molecular weight material and the binder resin. Further, when the luminescent material is a high molecular weight material, it is a necessary condition that a favorable thin film can be formed by coating and drying the solution or the liquid dispersion containing the material itself. Preferably, for the organic low molecular weight material, chelate type organic metal complexes, polynulear or fused aromatic ring compounds, perylene derivatives, cumarin derivatives, styrylarylene derivatives, silole derivatives, oxazole derivatives, oxathiazole derivatives, and oxadiazole derivatives can be used. For high molecular weight material, polyparaphenylene derivatives, polyparaphenylenevinylene derivatives, polythiophene derivatives, polyacetylene derivatives and the like can be used.

Preferred specific examples of the luminescent materials can include the following compounds (IV-1) to compounds (IV-15), with no particular restriction to them. n and x each represents, independently, an integer of 1 or greater.

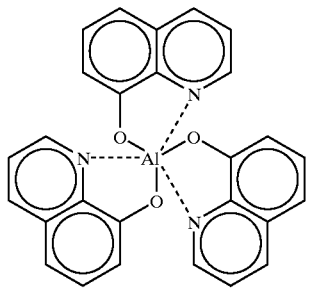
(IV-1)

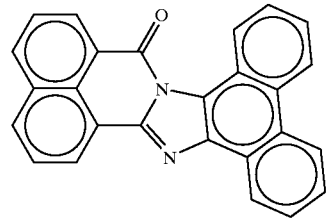
(IV-2)

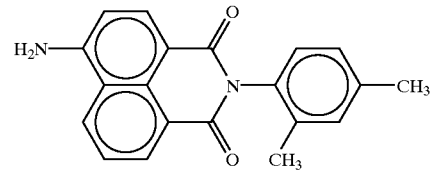
(IV-3)

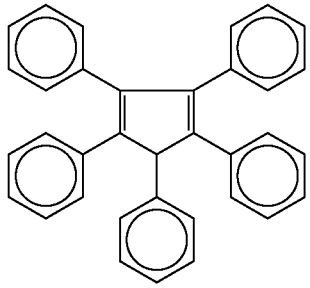
(IV-4)

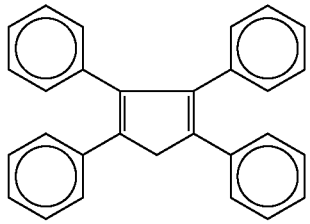
(IV-5)

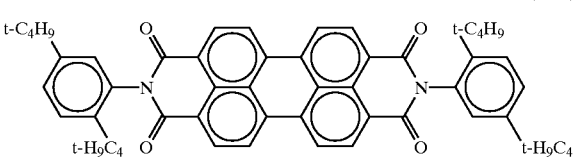
(IV-6)

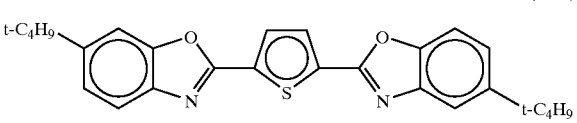
(IV-7)

(IV-8)
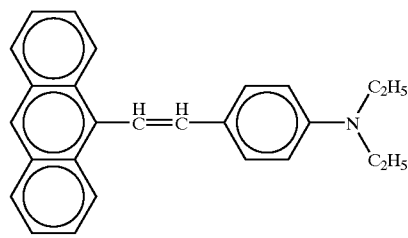

(IV-9)
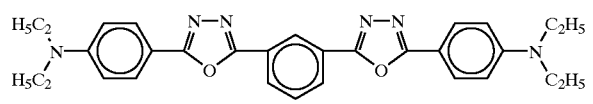

(IV-10)

(IV-11)
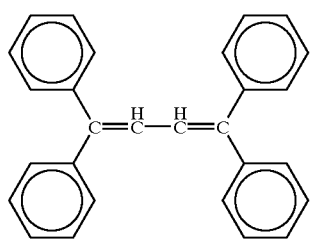

(IV-12)
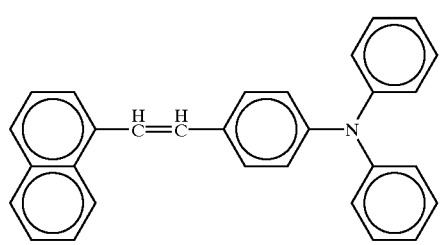

(IV-13)
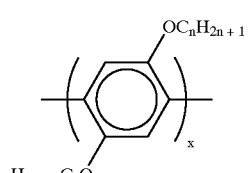

(IV-14)
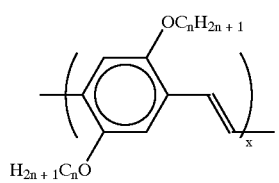

(IV-15)
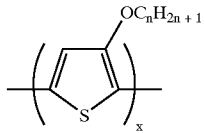

With an aim of improving the durability and the luminous efficacy of the organic EL device, a dye compound different from the luminescent material may also be doped as a guest material in the luminescent material. When the luminescent layer is formed by vacuum vapor deposition, doping is conducted by simultaneous vapor deposition. When the luminescent layer is formed by coating and drying a solution or liquid dispersion, doping is conducted by mixing the dye into the solvent or the liquid dispersion. The ratio of the doping of the dye compound in the luminescent layer is about from 0.001 to 40% by weight and, preferably, about from 0.001 to 10% by weight. As the dye compound used for the doping, organic compounds having good compatibility with the luminescent material and not hindering the formation of favorable thin films of the luminescent material are used and, preferably, DCM derivatives, quinacridone derivatives, rubrene derivative and porphyrin are used.

Preferred specific examples of the dye compound can include the following compounds (V-1), (V-4), with no particular restriction to them.

(V-1)
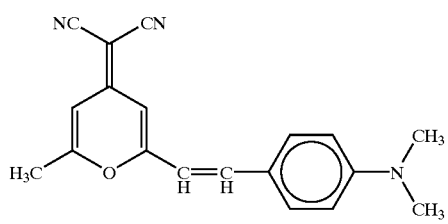

(V-2)
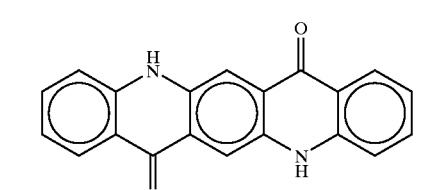

(V-3)
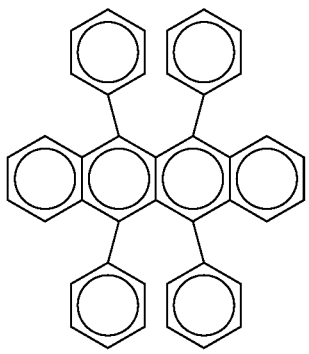

-continued (V-4)

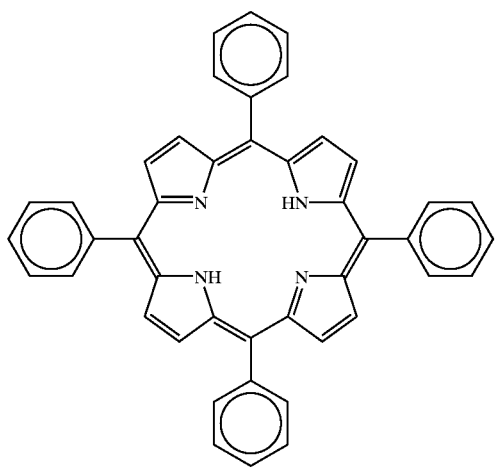

Further, when a luminescent material which can be vacuum deposited or coated and dried as a solution or a liquid dispersion but does not form a favorable thin film or does not show distinct electron transporting property is used, an electron transporting layer may be disposed between the luminescent layer 4 and the back electrode 6 with an aim of improving the durability or improving the luminous efficacy of the organic electroluminescence device. As the electron transporting material used for such electron transporting layer, those organic compounds capable of forming thin films by the vacuum vapor deposition method are preferred and oxadiazole derivatives, nitro-substituted fluolenone derivatives, diphenoquinone derivatives, thiopyran dioxide derivative and fluorenylidene methane derivative may be used.

Preferred specific examples for the electron transporting material can include the following compounds (VI-1) to (VI-3), with no particular restriction.

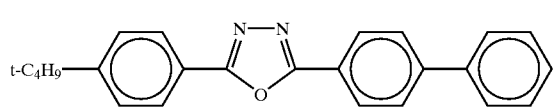
(VI-1)

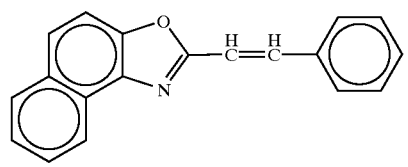
(VI-2)

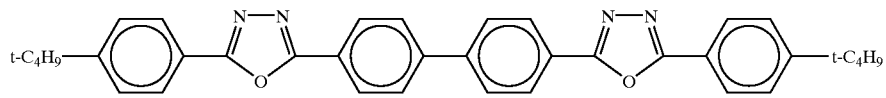
(VI-3)

In the layer constitution of the organic EL device shown in FIG. 2, the luminescent layer 5 having the carrier transporting property is an organic compound layer formed by dispersing 50% by weight or less of a luminescent material in a hole transporting polyester as defined above and the compounds (IV-1) to (IV-15) are suitably used for the luminescent material. Further, 10 to 50% by weight of the electron transporting material may be dispersed for controlling the balance between the holes and electrons injected in the organic EL device, or an electron transporting layer including the electron transporting material may be interposed between the luminescent layer 5 having the carrier transporting property and the back electrode 6. As the electron transporting material defined above, an organic compound showing no intense inter-electron effect with the hole transporting polyester as defined above is used and the following compound (VII) is preferably used, with no particular restriction. In the same manner, a hole transporting material other than the hole transporting polyester, preferably, a tetraphenylene diamine derivative may be used in an appropriate amount being dispersed simultaneously for controlling the hole charge mobility. Further, a dye compound different from the luminescent material may also be doped.

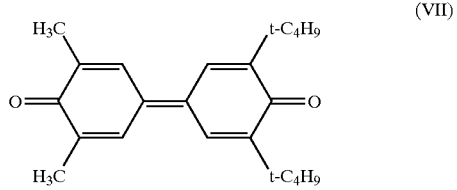
(VII)

As the back electrode 6 in FIG. 1 and FIG. 2, metals capable of vacuum vapor deposition and having a small work function for electron injection are used and, magnesium, aluminum, silver, indium and alloys thereof are particularly preferred.

In the organic EL device according to this invention described above, the hole transporting layer 3 is formed by using the hole transporting polyester as defined above and, optionally, other hole transporting material and the luminescence material 5 having the carrier transporting property is formed by using the carrier transporting polyester, and the luminescent material and, optionally, a dye compound, an electron transporting material and other hole transporting material, by dissolving or dispersing in an appropriate organic solvent, and forming a film by using the obtained coating solution on the transparent electrode 2, for example, by a spin coating method, a dipping method or a casting method.

The thickness of each of the hole transporting layer 3, the luminescent layer 4 and the luminescent material 5 having the carrier transporting property is about from 0.005 to 10 μm, preferably, from 0.03 to 2 μm while depending on the material. The dispersed state of the luminescent material may be a molecule-dispersed state or a fine particuledispersed state. In order to attain the molecule-dispersed state, a solvent in common with the hole transporting polyester as defined above, the luminescent material, the electron transporting material and other hole transporting material should be used as the dispersing solvent. In order to attain the particulate-dispersed state, the dispersing solvent has to be selected while considering the dispersibility of the luminescent material, and the solubility of the electron transporting material, the hole transporting polyester as defined above and other hole transporting material. For fine particulate dispersion, a ball mill, a sand mill, a paint shaker, an attritor, a homogenizer and a ultrasonic method or the like can be utilized.

Then, on the organic compound layer containing the hole transporting polyester as defined above, a luminescent material, an electron transporting material and a back electrode are formed by using the vacuum vapor deposition method in accordance with the layer constitution of each organic EL device. With the procedures described above, the organic EL device can be manufactured easily. The thickness for each of the luminescent layer having the electron transporting property and the electron transporting layer to be laminated is preferably within a range of less than 0.3 $\mu$m and, preferably, from 0.03 to 0.1 $\mu$m.

The organic EL device according to this invention can emit light by applying a DC voltage, for example, of 4 to 20 V at a current density of 1 to 200 mA/cm$^2$ between the pair of electrodes.

EXAMPLE

Examples of this invention are to be explained below but the invention is not restricted to such examples. The hole transporting polyester as defined above used in this example was synthesized as described below.

Synthesis Example 1

Synthesis of Exemplified Polymer (15)

2.0 g of N,N'-bis($\alpha$-naphthyl)-N,N'-bis[4-(2-methoxycarbonylethyl)phenyl]-[1,1'-biphenyl]-4,4'-diamine, 8.0 g of ethylene glycol and 0.1 g of tetrabutoxy titanium were charged in a 50 ml flask and stirred under heating at 200° C. for three hours in a nitrogen gas stream. After confining that N,N'-bis($\alpha$-naphthyl)-N,N'-bis[4-(2-methoxycarbonylethyl)phenyl]-[1,1'-biphenyl]-4,4'-diamine was consumed, pressure was reduced to 4.9 Pa and reaction was continued by heating at 230° C. while distilling off ethylene glycol for three hours. Then, the system was cooled to a room temperature, the reaction product was dissolved in 50 ml of toluene, insoluble matters were filtrated and the filtrate was dropped in 250 ml of methanol under stirring to precipitate a polymer. The resultant polymer was filtered, cleaned thoroughly with methanol and then dried to obtain 1.8 g of the hole transporting polyester (exemplified polymer (15)). The molecular weight: Mw=1.08×10$^5$ (converted as styrene) being measured by GPC and p (p in the general formula (II)) determined from the molecular weight of the monomer was about 140.

Synthesis Example 2

Synthesis of Exemplified Polymer (26)

2.0 g of N,N'-bis(terphenyl)-N,N'-bis[4-(2-methoxycarbonylethyl)phenyl]-[1,1'-biphenyl]-4,4'-diamine, 8.0 g of ethylene glycol and 0.1 g of tetrabutoxy titanium were charged in a 50 ml flask and stirred under heating at 200° C. for three hours in a nitrogen gas stream. After confirming that N,N'-bis(terphenyl)-N,N'-bis[4-(2-methoxycarbonylethyl)phenyl]-[1,1'-biphenyl]-4,4'-diamine was consumed, pressure was reduced to 4.9 Pa and reaction was continued by heating at 230° C. while distilling off ethylene glycol for three hours. Then, the system was cooled to a room temperature, the reaction product was dissolved in 50 ml of toluene, insoluble matters were filtrated and the filtrate was dropped in 250 ml of methanol under stirring to precipitate a polymer. The resultant polymer was filtered, cleaned thoroughly with methanol and then dried to obtain 1.9 g of the hole transporting polyester (exemplified polymer (26)). The molecular weight: Mw=1.20×10$^5$ (converted as styrene) being measured by GPC and p (p in the general formula (II)) determined from the molecular weight of the monomer was about 123.

Synthesis Example 3

Synthesis of Exemplified Polymer (81)

2.0 g of N,N'-bis($\alpha$-naphthyl)-N,N'-bis[4-(2-methoxycarbonylethyl)phenyl]-[1,1'-terphenyl]-4,4'-diamine, 8.0 g of ethylene glycol and 0.1 g of tetrabutoxy titanium were charged in a 50 ml flask and stirred under heating at 200° C. for three hours in a nitrogen gas stream. After confirming that N,N'-bis($\alpha$-naphthyl)-N,N'-bis[4-(2-methoxycarbonylethyl)phenyl]-[1,1'-terphenyl]-4,4'-diamine was consumed, pressure was reduced to 4.9 Pa and reaction was continued by heating at 230° C. while distilling off ethylene glycol for three hours. Then, the system was cooled to a room temperature, the reaction product was dissolved in 50 ml of toluene, insoluble matters were filtrated and the filtrate was dropped in 250 ml of methanol under stirring to precipitate a polymer. The resultant polymer was filtered, cleaned thoroughly with methanol and then dried to obtain 1.8 g of the hole transporting polyester (exemplified polymer (81)). The molecular weight: Mw=1.00×10$^5$ (converted as styrene) being measured by GPC and p (p in the general formula (II)) determined from the molecular weight of the monomer was about 110.

Example 1

An organic EL device identical with the constitution shown in FIG. 1 was manufactured.

5 wt % solution of the hole transporting polyester obtained in Synthesis Example 1 [exemplified polymer 15] (Mw=1.08×10$^5$) in dichloroethane was prepared and filtered through a polytetrafluoroethylene (PTFE) filter of 0.1 $\mu$m. The solution was used and coated by a dipping method on a glass substrate having a rectangular ITO electrode of 2 mm width formed thereon by etching (transparent insulative substrate 1 on which a transparent electrode 2 was formed), to form a hole transporting layer 3 of about 0.1 $\mu$m thickness. After drying thoroughly, the exemplified compound (IV-1) purified by sublimation as the luminescent material was charged in a tungsten boat and vapor-deposited by a vacuum vapor deposition method to form a luminescent layer 4 of 0.05 $\mu$m thickness on the hole transporting layer 3. The vacuum degree was 1.33×10$^{-3}$ Pa and the boat temperature was 300° C. Successively, an Mg—Ag alloy was vapor-deposited by simultaneous vapor deposition to prepare a back electrode 6 of 2 mm width and 0.15 $\mu$m thickness so as to intersect the ITO electrode. The effective area of the manufactured organic EL device was 0.04 cm$^2$.

Example 2

An organic EL device identical with the constitution shown in FIG. 2 was manufactured.

One part by weight of the hole transporting polyester obtained in Synthesis Example 1 [exemplified polymer 15]

(Mw=1.08×10⁵) and one part by weight of the exemplified compound (IV-1) were mixed to prepare a 10 wt % solution in dichloroethane was prepared and filtered through a PTFE filter of 0.1 μm. The solution was used and coated by a dipping method on a glass substrate having a rectangular ITO electrode of 2 mm width formed thereon by etching (transparent insulative substrate 1 on which a transparent electrode 2 was formed), to form a luminescent layer 5 having a carrier transporting property of about 0.15 μm thickness. After drying thoroughly, an Mg—Ag alloy was vapor-deposited by simultaneous vapor deposition to prepare a back electrode 6 of 2 mm width and 0.15 μm thickness so as to intersect the ITO electrode. The effective area of the prepared organic EL device was 0.04 cm².

Example 3

An organic EL device identical with the constitution shown in FIG. 2 was manufactured.

Two parts by weight of the hole transporting polyester obtained in Synthesis Example 1 [exemplified polymer 15] (Mw=1.08×10⁵), 1 part by weight of the exemplified compound (V-1) as the dye compound and 1 part by weight of the exemplified compound (VI-1) were mixed to prepare a 10 wt % solution in dichloroethane and filtered through a PTFE filter of 0.1 μm. The solution was used and coated by a dipping method on a glass substrate having rectangular ITO electrode of 2 mm width formed thereon by etching (transparent insulative substrate 1 on which a transparent electrode 2 was formed), to form a luminescent layer 5 having a carrier transporting property of about 0.15 μm thickness. After drying thoroughly, an Mg—Ag alloy was vapor-deposited by simultaneous vapor deposition to prepare a back electrode 6 of 2 mm width and 0.15 μm thickness so as to intersect the ITO electrode. The effective area of the manufactured organic EL device was 0.04 cm².

Example 4

An organic EL device was manufactured in the same manner as in Example 1 except for using the hole transporting polyester [exemplified polymer (26)] (Mw=1.20×10⁵) obtained in Synthesis Example 2.

Example 5

An organic EL device was manufactured in the same manner as in Example 2 except for using the hole transporting polyester [exemplified polymer (26)] (Mw=1.20×10⁵) obtained in Synthesis Example 2.

Example 6

An organic electroluminescence device was manufactured in the same manner as in Example 3 except for using the hole transporting polyester [exemplified polymer (26)] (Mw=1.20×10⁵) obtained in Synthesis Example 2.

Example 7

An organic EL device was manufactured in the same manner as in Example 1 except for using the hole transporting polyester [exemplified polymer (81)] (Mw=1.00×10⁵) obtained in Synthesis Example 3.

Example 8

An organic EL device was manufactured in the same manner as in Example 2 except for using the hole transporting polyester [exemplified polymer (81)] (Mw=1.00×10⁵) obtained in Synthesis Example 3.

Example 9

An organic EL device was manufactured in the same manner as in Example 3 except for using the hole transporting polyester [exemplified polymer (81)] (Mw=1.00×10⁵) obtained in Synthesis Example 3.

Comparative Example 1

One part by weight of the hole transporting material represented by the following structural formula (VIII), 1 part by weight of the exemplified compound (IV-1) as the luminescent material and 1 part by weight of polymethyl methacrylate (PMMA) as a binder resin were mixed to prepare a 10 wt % solution in dichloroethane and filtered through a PTFE filter of 0.1 μm. The solution was used and coated by a dipping method on a glass substrate having a rectangular ITO electrode of 2 mm width formed thereon by etching to form a luminescent layer having a carrier transporting property of about 0.15 um thickness. After drying thoroughly, an Mg—Ag alloy was vapor-deposited by simultaneous vapor deposition to form a back electrode of 2 mm width and 0.15 mm thickness so as to intersect the ITO electrode. The effective area of the manufactured organic EL device was 0.04 cm².

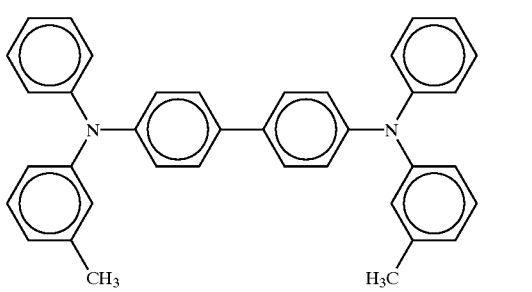

(VIII)

Comparative Example 2

Two parts by weight of polyvinyl carbazole (PVK) as the hole transporting polymer, 0.1 parts by weight of the exemplified compound (V-1) as the dye compound and 1 part by weight of the exemplified compound (VI-1) as the electron transporting material were mixed to prepare a 10 wt % solution in dichloroethane and filtered through a PTFE filter of 0.1 μm. A luminescent layer having a carrier transporting property of about 0.15 μm thickness was formed by a dipping method using the solution on a glass substrate having a rectangular ITO electrode of 2 mm width formed thereon by etching. After drying thoroughly, an Mg—Ag alloy was vapor-deposited by simultaneous vapor deposition to form a back electrode of 2 mm width and 0.15 μm thickness so as to intersect the ITO electrode. The effective area of the manufactured organic EL device was 0.04 cm².

The thus manufactured organic EL devices were applied with a DC voltage in vacuum (0.133 Pa) with the ITO electrode as a positive side (anode) and the Mg—Ag back electrode as the negative side (cathode), light emission was measured and the maximum brightness and the luminance color were evaluated. The results are show in the following Table 13. The light emission life of the organic EL devices was measured in a dry nitrogen. In the evaluation for the light emission life, the current value was set such that the initial brightness was 50 cd/m² and the time of period during which the brightness was decayed to one-half of the initial value at the constant current driving was defined as the device life time (hour). The driving current density in this case is shown together with the device lifetime in the following Table 13.

TABLE 13

| | Maximum brightness (cd/m²) | Luminance color | Driving current density (mA/cm²) | Device life (hour) |
|---|---|---|---|---|
| Example 1 | 740 | green | 7.0 | 30 |
| Example 2 | 500 | green | 6.8 | 32 |
| Example 3 | 520 | red | 6.9 | 28 |
| Example 4 | 800 | green | 6.6 | 31 |
| Example 5 | 620 | green | 6.5 | 31 |
| Example 6 | 580 | red | 7.2 | 26 |
| Example 7 | 720 | green | 7.0 | 28 |
| Example 8 | 750 | green | 6.9 | 30 |
| Example 9 | 680 | red | 7.1 | 31 |
| Comp. Example 1 | 480 | green | 9.5 | 18 |
| Comp. Example 2 | 450 | red | 9.8 | 15 |

From the results of Table 13, it can be seen that the organic EL devices of this invention in Examples 1 to 9 using the hole transporting polyesters as defined above show high brightness and have long device life.

This invention can provide an organic electroluminescence device easy to manufacture, having high brightness and excellent durability. The hole transporting polyester as defined above has ionization potential and hole mobility suitable to the organic EL device and can form a favorable thin film by using, for example, a spin coating or dipping method and, accordingly, the organic EL device according to this invention formed by using the polyester shows a sufficiently high brightness and can set a relatively thick film, so that there is less failure such as pinholes and increase of the area is easy.

The entire disclosure of Japanese Patent Application No. 2000-313190 filed on Oct. 13, 2000 including specification, claims, drawings and abstract is incorporated herein by reference in its entirety.

What is claimed is:

1. An organic electroluminescence device having at least one organic compound layer put between a pair of electrodes comprising an anode and a cathode at least one of which is transparent or semitransparent, wherein at least one of the organic compound layers contains one or more kinds of hole transporting polyesters comprising a repeating unit containing, as a partial structure, at least one structure selected from the group consisting of the following general formulae (I-1) and (I-2):

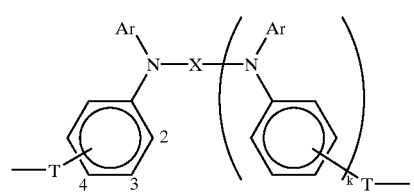

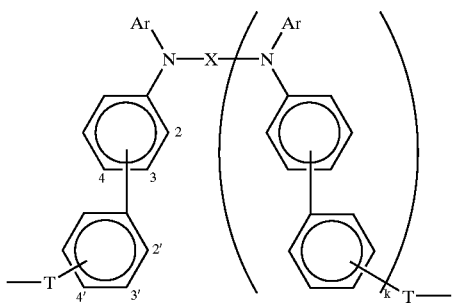

where Ar represents a substituted or unsubstituted monovalent polynuclear aromatic ring having a number of aromatic rings of from 3 to 10, or a substituted or unsubstituted monovalent condensed aromatic ring having a number of aromatic rings of from 3 to 10, X represents a substituted or unsubstituted bivalent aromatic group, T represents a bivalent linear hydrocarbon group of 1 to 6 carbon atoms or a bivalent branched hydrocarbon group of 2 to 10 carbon atoms and k represents 0 or 1.

2. The organic electroluminescence device according to claim 1, having a hole transporting layer as a first organic compound layer containing one or more hole transporting polyesters comprising repeating units containing, as a partial structure, at least one (structure selected from the group consisting of the general formulae (I-1) and (I-2), and a luminescent layer as a second a organic compound layer in this order on a transparent electrode.

3. The organic electroluminescence device according to claim 1, wherein the at least one organic compound layer is a single layer.

4. The organic electroluminescence device according to claim 3, wherein the at least one organic compound layer contains at least one of a luminescent material, a hole transporting material and an electron transporting material.

5. The organic electroluminescence device according to claim 1, wherein the hole transporting polyester is a polyester represented by the general formula (11) or (III):

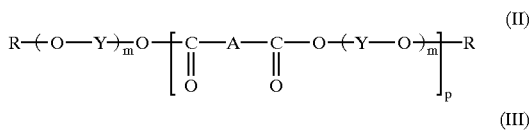

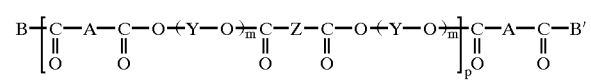

where A represents at least one member selected from the structures represented by the general formulae (I-1) and (I-2), R represents a hydrogen atom, an alkyl group, a substituted or unsubstituted aryl group or a substituted or unsubstituted aralkyl group, Y represents a dihydric alcoholic residue, Z represents a dibasic carboxylic residue, B and B' each independently represents —O—(Y—O)$_m$R or —O—(Y—O—)$_m$—CO—Z—CO—OR', in which R, Y and Z have, respectively, the same meanings as above and R' represents an alkyl group, a substituted or unsubstituted aryl group or a substituted or unsubstituted aralkyl group and m represents an integer of 1 to 5, m represents an integer of 1 to 5 and p represents an integer of 5 to 5000.

6. The organic electroluminescence device of claim 1, wherein Ar represents a substituted or unsubstituted monovalent polynuclear aromatic ring having a number of aromatic rings of from 3 to 10.

7. The organic electroluminescence device of claim 1, wherein Ar represents a substituted or unsubstituted monovalent condensed aromatic ring having a number of aromatic rings from 3 to 10.

* * * * *